(12) United States Patent
Coehoorn

(10) Patent No.: US 6,384,600 B1
(45) Date of Patent: May 7, 2002

(54) MAGNETIC FIELD SENSOR COMPRISING A SPIN TUNNELING JUNCTION ELEMENT

(75) Inventor: Reinder Coehoorn, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/372,960

(22) Filed: Aug. 12, 1999

(30) Foreign Application Priority Data

Aug. 14, 1998 (EP) ............................................. 98202728
Jun. 10, 1999 (EP) ............................................. 99201841

(51) Int. Cl.$^7$ .......................... G01R 33/02; G01R 33/09
(52) U.S. Cl. ...................... 324/252; 338/32 R; 428/692
(58) Field of Search .......................... 324/207.21, 252, 324/235; 338/32 R; 428/692, 900; 360/324.2

(56) References Cited

U.S. PATENT DOCUMENTS 5,677,625 A * 10/1997 Dieny ......................... 324/252
5,686,837 A   11/1997 Coehoorn et al. ........... 324/252
6,185,080 B1 * 2/2001 Gill .......................... 360/324.2

FOREIGN PATENT DOCUMENTS

WO           200010023        * 2/2000

* cited by examiner

Primary Examiner—Walter Snow
(74) Attorney, Agent, or Firm—Dicran Halajian

(57) ABSTRACT

A strongly miniaturizable magnetic field sensor is based on four spin tunnel junctions, together forming a Wheatstone bridge. The magnetically sensitive electrode functions as well as a laminated flux concentrator, resulting in a low noise single domain configuration, and allowing for magnetization flipping for offset correction. The very simple design also allows easy definition of the fixed magnetization direction of the counter electrode. Very high output voltage combined with very low power.

35 Claims, 5 Drawing Sheets

MAGNETIC FIELD SENSOR COMPRISING A SPIN TUNNELING JUNCTION ELEMENT

BACKGROUND OF THE INVENTION

It is known that magnetic field sensors can be made based on anisotropic magnetoresistance (AMR) or giant magnetoresistance (GMR) elements. However, several properties of AMR and the more sensitive GMR sensor structures may still be a limiting factor for some types of applications. Firstly, the AMR effect and the GMR effect both occur in metallic thin films, resulting in a relatively low sheet resistance. As in the device geometry used the current is directed parallel to the plane of the film it is advantageous from the point of view of a large output voltage to fabricate the element(s) in the form of a long meandering stripe pattern. However, this then results in a rather large sensor area (up to a few mm$^2$ typically). Another negative consequence of the use of a meandering pattern is that this reduces the efficiency of the possible use of a flux concentrator. Secondly, proper functioning of AMR and GMR sensors requires the deposition of additional patterned structures, thereby complicating the manufacturing process. AMR sensors require the deposition of a so-called barber pole overlay to linearize their resistance versus field curve. A factor that complicates the fabrication of both AMR and GMR sensors is that their proper functioning (no zero-field offset) requires the use of an external coil or of integrated conductors (insulated from the sensitive part of the structure) for flipping the magnetization direction of the magnetically sensitive layers.

SUMMARY OF THE INVENTION

The present invention provides a novel class of magnetic field sensors, advantageously making use of magnetoresistive spin tunneling junctions in order to realize sensors with improved sensitivity, miniaturizability and simplicity of design. According to the invention, a magnetic field sensor is characterized in that the sensor comprises a first common, elongated ferromagnetic layer F1, with an in plane easy magnetization axis normal to the elongation direction of said layer F1, and two further ferromagnetic layers F2 with opposite magnetization directions, situated at some distance from each other in the longitudinal direction of layer F1, forming a pair of magnetoresistance elements of the spin tunnel junction type having an electrical barrier layer sandwiched between the ferromagnetic layers F1, F2, and means to measure resistance across the spin tunnel junctions. Such a sensor enables magnetic fields to be measured, in operation, which are applied in the plane of the layer F1 and normal to the easy axis direction of the layer F1 (i.e. in the direction of elongation of layer F1). In preferred embodiments two crossing layers F1 and F2 are used, forming two pairs of tunnel junctions, thus forming a simple, yet very sensitive Wheatstone bridge arrangement.

The elongated form of the layer F1 also offers the advantage that the flux of the field to be measured is concentrated at the magnetoresistance elements of the spin tunnel junction type, thus increasing the sensitivity of the design. The sensor area can be reduced. The design of the F1 layers can be further optimized to increase flux concentration, for instance by choosing the width of the F1 layer so as to be smallest close to the magnetoresistance element(s) and larger at a greater distance from said magneto-resistance element(s).

BRIEF DESCRIPTION OF THE DRAWINGS

These and other aspects of the invention will be apparent from and elucidated with reference to the embodiments described hereafter. In the drawings.

DESCRIPTION OF THE PREFERRED EMBODIMENTS

The FIGS. are schematic.

Figure 1A:
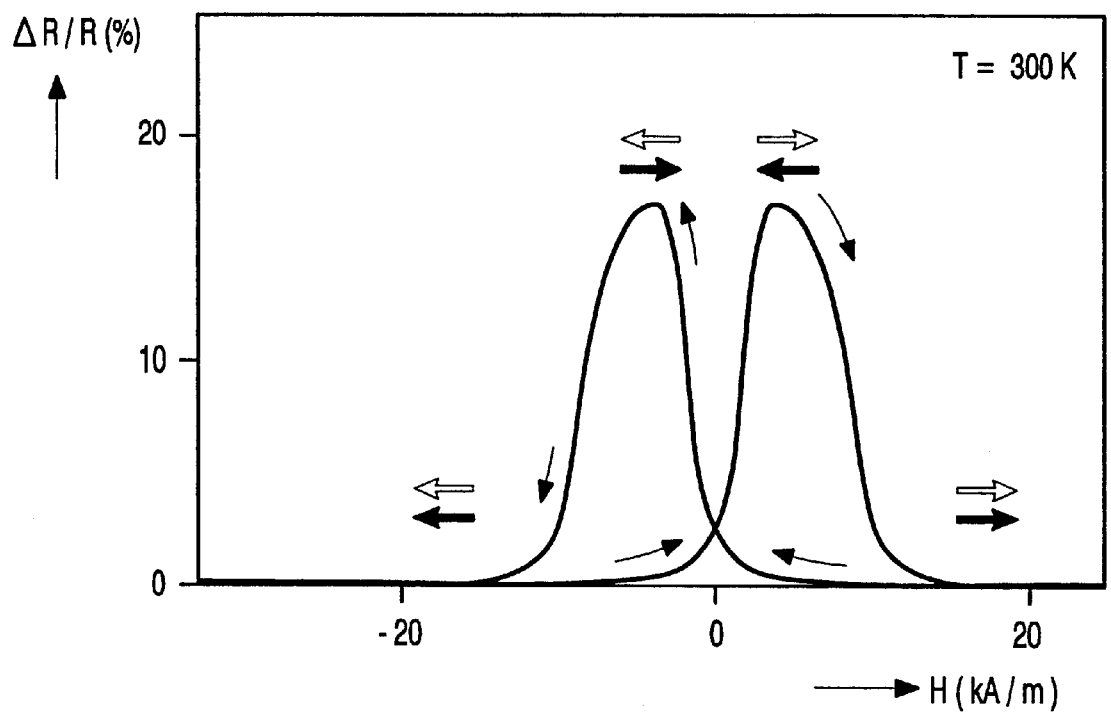
FIG. 1a shows the dependence of resistance on the applied field for a spin tunnel junction.
Figure 1B:
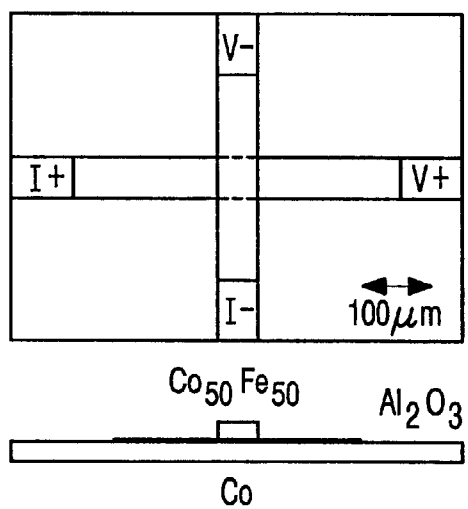
FIG. 1b schematically shows a spin tunnel junction.
Figure 2:
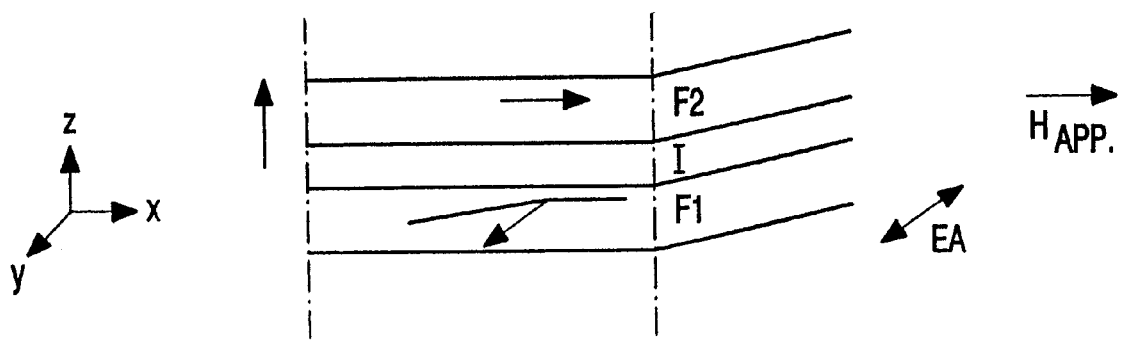
FIG. 2 illustrates a multilayer structure within which the layers are ferromagnetically coupled.
Figure 3:
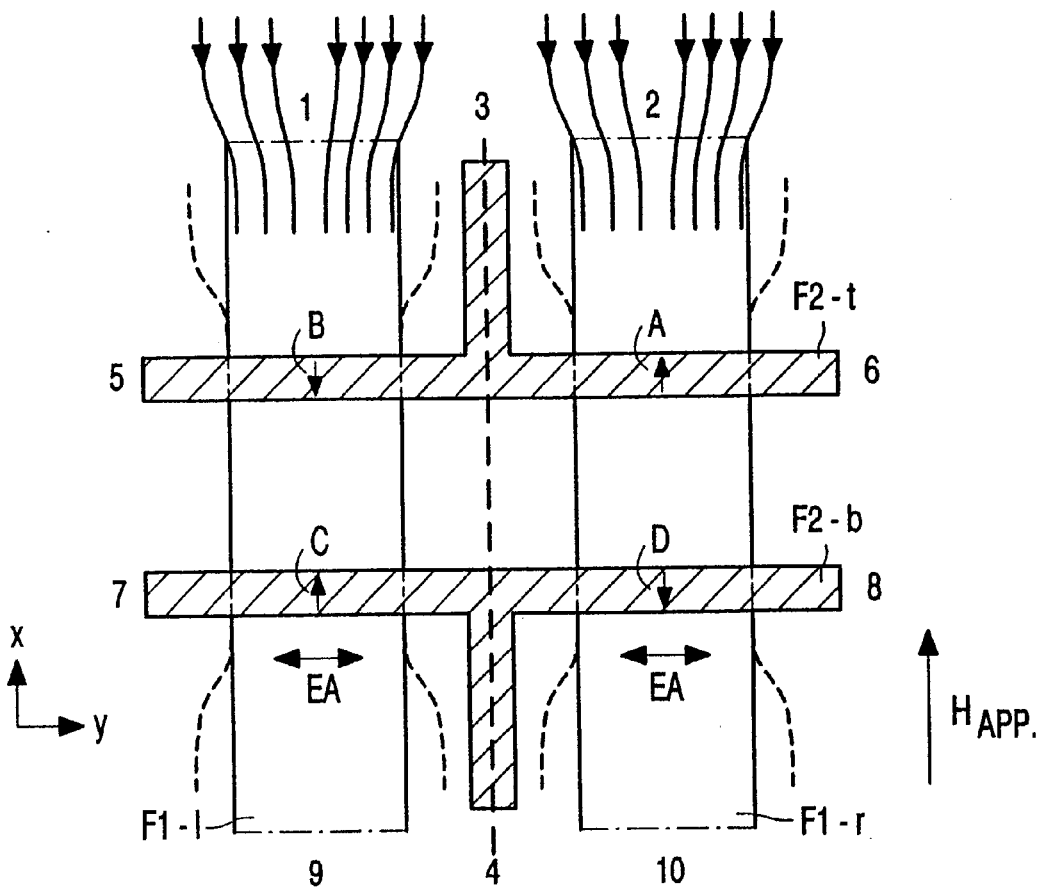
FIG. 3. schematically shows a sensor design in accordance with the invention.

Spin tunneling junctions comprise an insulating thin film, sandwiched between a pair of metallic magnetic thin films (F1 and F2). The electrical conduction across the insulating barrier is the result of quantum-mechanical tunneling. The conductivity is proportional to the area of the junction, i.e., to the joint area of the lower and upper magnetic layers. Each of the layers has an in-plane easy magnetization axis. Upon switching the magnetization in the magnetic layers from parallel to antiparallel the resistance can increase by more than 20% at room temperature, as has been demonstrated recently by several groups. The effect is linear, to a close approximation, in the cosine of the angle between the magnetization directions of the two layers. FIG. 1a shows, as a function of the applied magnetic field H, the resistance R, where the vertical axis shows the resistance difference (in %) between a measured resistance and the resistance when the magnetization in both layers is parallel. R is zero when the magnetization in both layers is parallel. At very high applied magnetic fields the magnetization in both layers is parallel, indicated in FIG. 1 by parallel arrows. When the applied field is reduced from a large positive value to a value near zero the magnetization of one of the layers is reversed, so that the magnetization in the layers is anti-parallel (indicated by anti-parallel arrows above the left-hand peak in the resistance). This causes the resistance to rise. At larger negative values the magnetization of the other layer is also reversed (thus the magnetizations are again parallel indicated by parallel arrows to the left of the left hand peak), which reduces the resistance. Increasing the applied field induces a similar effect as that indicated by the right hand peak in the resistance. The property that the resistance is dependent on the magnetization being parallel or anti-parallel makes it possible to realize a linear variation of the junction resistance versus the applied magnetic field, for a structure in which the magnetic field is applied perpendicularly to the easy magnetization axis of one of the two magnetic layers (F1), whereas the magnetization of the second magnetic layer (F2) is pinned in a certain direction, e.g. by using a material for the F2 layer which has a much higher coercivity than the material of the F1 layer or e.g. by bringing it in exchange contact with an antiferromagnetic (AF) layer, a permanent magnet layer, a so-called 'artificial antiferromagnet' (AAF), i.e. a multilayer within which the layers are antiferromagnetically exchange coupled or an AAF and an AF structure combined. The structure is shown schematically in FIG. 2. FIG. 2 shows schematically the sandwich structure of F1/I/F2 layers. The direction of the current during measuring is indicated by the arrow pointing upward (in the z-direction), the current could of course also flow in the opposite direction (downward). The magnetization in the layers is schematically indicated by an arrow, where in layer F1 it is schematically indicated that the magnetization may rotate from a perpendicular orientation towards a parallel or anti-parallel orientation (in respect of the direction of the magnetization of the layer F2) in response to a positive and negative applied field respectively. The direction of the applied field $H_{applied}$ as well as the easy axis direction (EA) of layer F1 are indicated in FIG. 2. For ease of comparison the easy axis direction is referred to as the y-axis, the direction perpendicular to the y-direction in the plane of the film is referred to as the x-direction (which corresponds, as is shown in FIG. 3, to the longitudinal direction of layer F1), and the direction perpendicular to the layers is referred to as the z-direction. The current direction is schematically indicated by the vertically oriented arrow, the current may of course also flow in the opposite direction depending on the voltage applied. A typical R vs $H_{applied}$ curve of such a sandwich structure is shown in FIG. 1a.

The insulating layer is often aluminum oxide, approximately $Al_2O_3$, although also other materials such as AlN, NiO or Hf—O have been used, with a thickness of 1 to 3 nm. The thickness should be sufficient to avoid direct metallic contact between the two electrode layers via so-called pin holes, and to magnetically (almost) decouple the two layers. The magnetic electrode layers may have a thickness of about 1 nm or more. They can be made of materials such as Co, Fe, Permalloy, etc. In the exemplary embodiment shown in FIG. 1b the F2 layer is comprised of $Co_{50}Fe_{50}$, the insulator layer I is comprised of $Al_2O_3$ and the F1 layer is comprised of Co. The magnetotunneling effect is determined predominantly by the magnetic layers at or very close to the interface with the insulating layer. Sandwiching the essential F1/Insulator/F2 junction elements in between other (conducting) layers does not substantially affect the electrical performance of the element, as long as the (high) tunneling resistance dominates the contact resistance. This is the case when the sheet resistance of the contact lead is smaller than the tunnel resistance. For 2 nm $Al_2O_3$ barrier layers, made by oxidation of an Al layer in an oxygen plasma, junctions between Co or Permalloy layers have a resistance of typically 1 MΩ for an area of $100 \mu m^2$. Much smaller junction resistances, leading to a lowering of the 4kTR thermal resistance noise and of the RC time may be obtained by making use of thinner barrier layers and/or by decreasing the height of the tunneling barrier. The high junction resistance, as compared to the sheet resistance of the contact leads, introduces interesting degrees of freedom in the design, as discussed below, and results in very small power dissipation (useful for applications in portable equipment).

A sensor design in accordance with the invention is shown in FIG. 3. It comprises two stripes F1-l and F1-r of a soft-magnetic metallic thin film, covered with a thin insulating barrier layer, on top of which a patterned structure formed by magnetic stripes F2-t and F2-b is deposited, within which stripes F2-t, F2-b the magnetization direction is pinned for instance by making use of an antiferromagnetic film, a permanent magnet film or an AAF (see above) or AAF+AF. The magnetization direction in this pinned layer is shown (by means of arrows A to D) in FIG. 3. By growth in a magnetic field that is directed in the film plane, perpendicularly to its long axis (or by annealing afterwards in a magnetic field along this direction) the easy axis (e.a.) direction of the F1 soft magnetic stripes is defined. The direction of highest sensitivity to the applied magnetic field is parallel to the longitudinal axis of the F1 stripes. The F1 layers act as flux concentrators. Schematically this is indicated in the top part of the FIG. by the field lines being concentrated in the F1-layers. The same concentrating effect on field lines occurs also in the z-direction.

It can be easily seen that the elements are arranged in the form of a Wheatstone bridge if a current source (not shown in FIG. 3 for simplicity) is connected via the soft magnetic stripes F1-l and F1-r (connection points 1 and 2), and if the output voltage is measured at connection points 3 and 4. In view of the symmetry of the structure, all four tunnel junctions (A–D) are equivalent, as is required for a properly functioning bridge. Within the concept of the invention a sensor in its simplest form may comprise the parts on either side of the dotted line, i.e. half a bridge, the other half of the bridge can in such circumstances be formed by simple fixed resistance elements. Although such an arrangement would reduce the sensitivity of the sensor, it would not be influenced by differences in flux concentration in the respective F1-layers or differences in R(H) curves between the different elements, so that a source of errors would be eliminated. Alternatively one of the halves of the Wheatstone bridge could be shielded from the applied field. This would reduce the sensitivity of the device, but also eliminate any errors due to differences in R(H) curves, while still offering a compensating effect against errors due to e.g. temperature effects. In this example the left and right F2-layers (A,B and C,D, respectively) are formed in a single F2 layer (F2-t, respectively F2-b), each F2 layer having one lead (3,4) common to two (A,B and C,D, respectively) elements. This is advantageous from the point of view of simplicity of the design. However, in other embodiments each of the elements A,B,C,D, may have its own F2 layer, with a separate lead. This would enable the introduction of preferably tunable resistance elements in said leads to fine-tune the bridge arrangement, and thereby increase the sensitivity of the sensor.

When F1 is not equal to F2, which is only correct at low applied voltages, compensation for an asymmetric I–V curve is possible by driving the bridge using an ac current. The device will function well within a wide range of dimensions. The lower limit of the junction area will be determined in part by the requirement that the junction resistance should not become too high. The upper limit will be determined in part by a yield argument: all junctions should remain free of electrically conducting pinholes. The width of the F1 and F2 stripes may be chosen such as to optimize the sensitivity of the junction and its micromagnetic properties. The width of the F1-layer may be larger at a distance from the elements than at or near the elements. In FIG. 3 this possibility is indicated by the dotted lines. Likewise the thickness of the F1 layer may be larger at a distance from the elements than at or near the elements. This leads to an increased concentration of flux, thereby increasing the sensitivity of the sensor.

The soft magnetic stripes fulfill or may fulfill four functions: as contact leads, flip conductors (see below), flux concentrators, and as the F1 electrode layer. The combination of the latter two functions (no leakage flux) makes the flux concentrator particularly efficient. Therefore smaller dimensions are required than for a given degree of flux concentration in combination with an AMR or GMR element. The magnetization direction in the pinned magnetic stripes F2 should be opposite for adjacent bridge elements (A,B,C,D), as indicated in FIG. 3 by opposite arrows. This 'programming' can be easily realized after fabrication of the entire structure in the following way:

1. in the case of pinning by using an AF exchange biasing layer:
   (i) Heating the entire device to a temperature above the blocking temperature of the AF, followed by cooling during which a local magnetic field is applied to the F layers by a properly directed current through the pinned F2 layer stripes. These currents can be applied by connecting connection points 3, 7 and 8 to a positive voltage, while connecting connection points 4, 5 and 6 to ground. At the same time all junctions are 'programmed' using this procedure. or:
   (ii) Local heating of the junctions by the subsequent application of a sufficiently large current through the F2 layers, in an external magnetic field that is parallel to the required exchange biasing direction, followed by cooling in this magnetic field by decreasing the current density. If the externally applied magnetic field is sufficiently strong the direction of the current is not relevant. Pairwise (A together with C, B together with D) programming is possible using this procedure.
2. In the case of an AAF consisting of a structure F2/NM/F2 (NM is a nonmagnetic metallic layer):
   'Programming' by applying a current according to the connection scheme mentioned under 1(i). So: no elevated temperature step required. At the same time all junctions can be programmed.
3. in the case of pinning using a permanent magnet layer:
   'Programming' by applying a current according to the connection scheme mentioned under 1(i). The resulting field should result in a well defined magnetic field in the F2 and the permanent magnetic layer. In order to realize this situation, a conducting nonmagnetic layer (Cu or Au, e.g.), deposited on top of the F2/permanent magnet layer structure, can be used. The sheet resistance of this conducting layer should be much lower than that of the two magnetic layers.

Figure 4A:
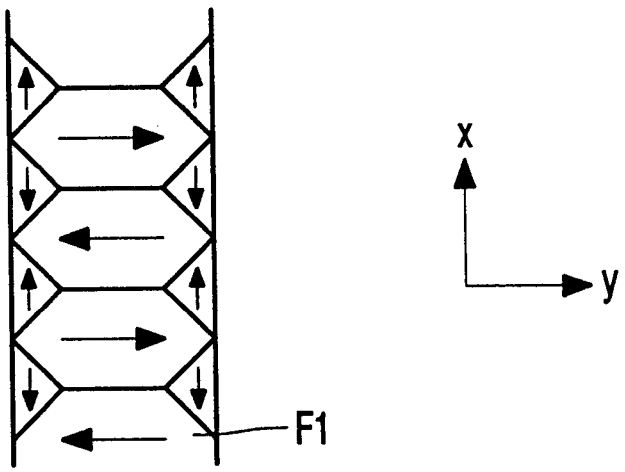
FIGS. 4a and 4b illustrate details of laminated layers for sensor designs in accordance with the invention.
Figure 4B:
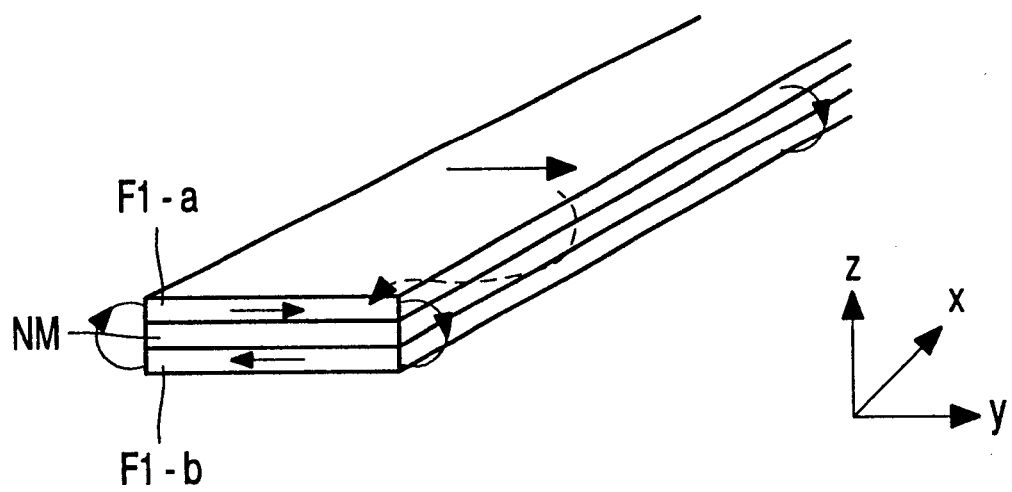

A very attractive feature of this design is that it allows for lamination of the softmagnetic layer(s) F1, with no substantial consequence for the tunneling magnetoresistance. The F1 layer then comprises a structure F1-a/NM/F1-b, where NM is a nonmagnetic metallic separation layer. A first advantage of lamination is that it improves the micromagnetic structure and stability of the soft magnetic layer. Without lamination the strips are expected to show a closure domain structure as shown schematically in FIG. 4a.

With lamination a closed flux structure can be realized, as is well known in the case of flux guides in write heads. Such a structure is stabilized by the magnetostatic interaction between the layers F1-a and F1-b and can, if required, be stabilized further by making use of antiferromagnetic exchange coupling due to a suitably chosen spacer layer. For this purpose the nonmagnetic coupling layer may for instance comprise Ru in a thickness of approximately 0.8–1 nm. Lamination will not affect the magnetoresistance, as only the direction of the magnetization of the softmagnetic layer closest to the insulating barrier will determine the tunneling current. A current in between contact points 1 and 9, and in between 2 and 10, may be used to define the magnetization directions in the upper and lower soft magnetic layers.

A very important second advantage is that it is easy then to flip the magnetization directions of these two magnetic layers F1, viz. by applying a current of opposite polarity (again by a voltage between connection points 1 and 9, or 2 and 10 (see FIG. 3). Flipping is used in present AMR sensors, and has been proposed for spin valve GMR sensors, for the purpose of correcting a bridge offset voltage. This is important in order to be able to perform precise dc magnetic field measurements. Using the design discussed, flipping can be realized without adding additional integrated or external conductors, thereby drastically simplifying the sensor design.

By making use of well chosen component materials, such as exchange biasing materials with a high blocking temperature and soft magnetic layers with a high thermal stability of the induced anisotropy, it is expected that the proposed structure meets the requirements for e.g. some automotive applications.

The following simplified variants are within the scope of the invention as claimed: a single bridge element having an elongated F1 layer and a semi-Wheatstone bridge (pair of two elements with preprogrammed opposite sensitivities making use of the same single soft magnetic stripe). The width of the softmagnetic F1 may be lowest close to the element, and larger at a greater distance from said element, in order to enhance the flux concentration. Trimming resisters could be added in series for improving the bridge balance.

Figure 5A:
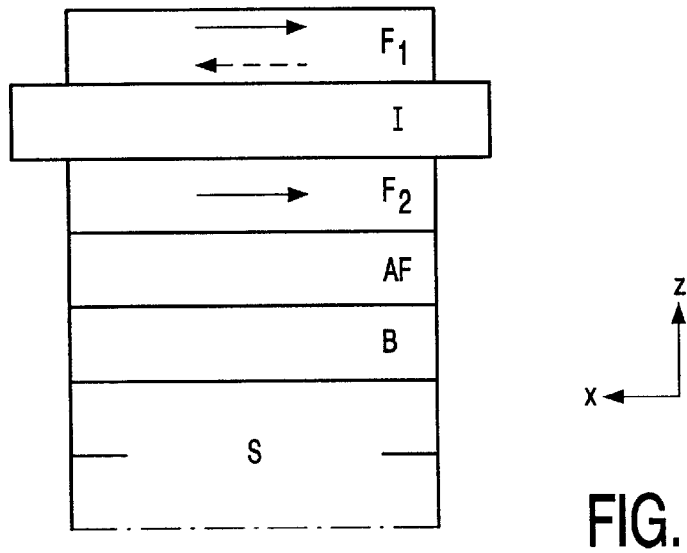
FIGS. 5A to 5C show details of several embodiments of the device in accordance with the invention.
Figure 5B:
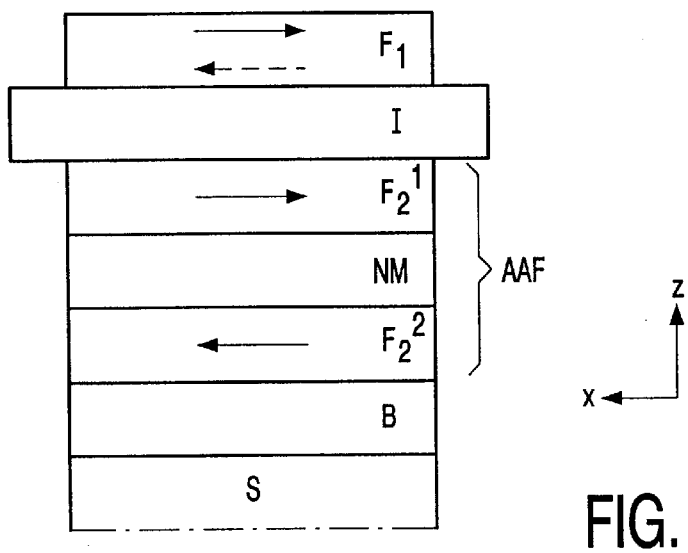
Figure 5C:
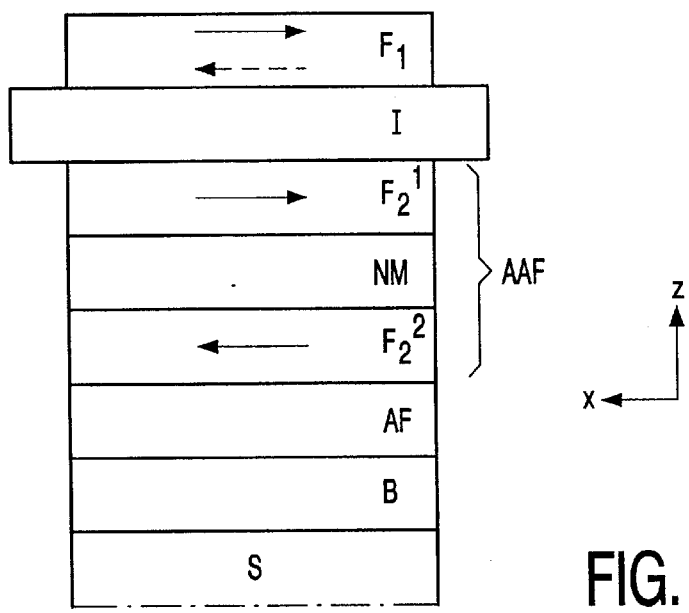
Figure 6A:
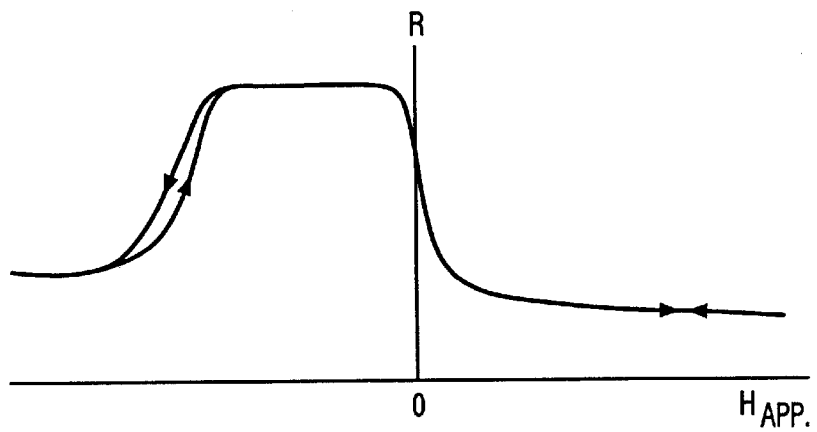
FIGS. 6A to 6C show resistance values as a function of the applied magnetic field for each of the devices shown in FIGS. 5A to 5C, respectively.
Figure 6B:
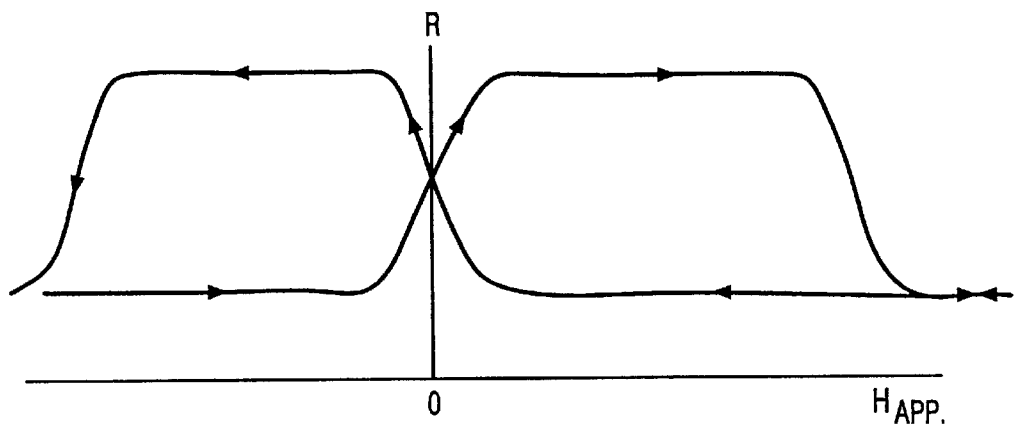
Figure 6C:
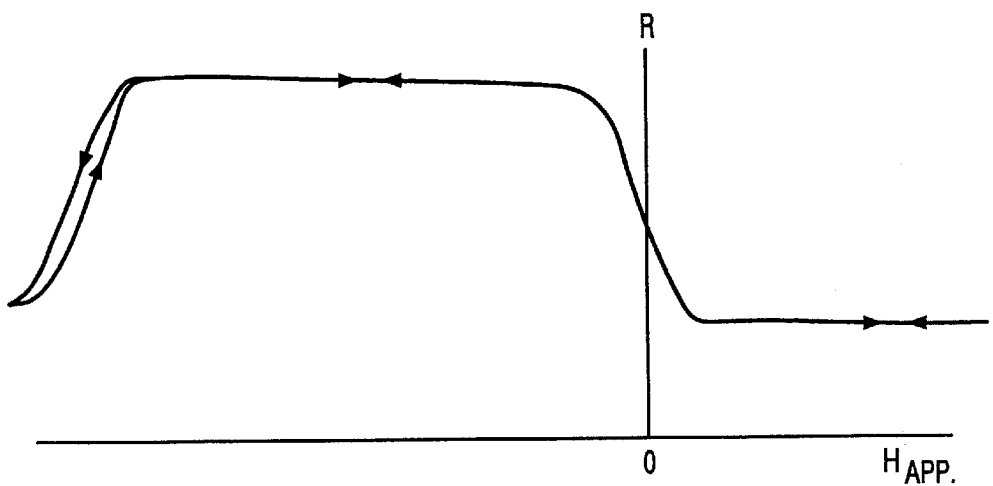

FIGS. 5A to 5C show details of several embodiments of the device in accordance with the invention. In these exemplary embodiments the F2 layer is pinned by bringing it in exchange contact with an antiferromagnetic (AF) layer (FIG. 5A), with a so-called 'artificial antiferromagnet' (AAF), i.e. a multilayer within which the layers are antiferromagnetically exchange coupled (FIG. 5B) and with the combination thereof (FIG. 5C). FIGS. 6A to 6C show typical resistance values as a function of an applied magnetic field for each of the devices shown in FIGS. 5A to 5C respectively.

In FIG. 5A, on a substrate S a buffer layer B (for instance a Ta layer) is deposited, on which an anti-ferromagnetic (AF) layer is provided. This anti-ferromagnetic layer pins the magnetization of ferromagnetic layer F2. Isolation barrier layer I is sandwiched between ferromagnetic layers F1 and F2. The resulting R(resistance) vs H (magnetic field) curve is schematically shown in FIG. 6A.

In FIG. 5B the F2 layer is pinned by making use of a so-called 'artificial antiferromagnet' (AAF), i.e. a multilayer ($F2^1$/NM $F2^2$) within which the layers are antiferromagnetically exchange coupled. The resulting R vs H curve is schematically shown in FIG. 6B.

In FIG. 5C both measures of FIGS. 5A and 5B are used, i.e. an AAF and an AF is used. The resulting R vs H curve is schematically shown in FIG. 6C.

The different layers (F1, I, F2, AF, NM, B etc) may be provided by known techniques such as sputtering or vapor deposition. Patterning of the layers may be done by using masks to mask parts which should not be covered by the layers, or by first applying a layer and then partly etching it away by known etching techniques to obtain a desired structural pattern.

Concluding:

A very miniaturized magnetic field sensor is based on two or four spin tunnel junctions, together forming half a Wheatstone bridge (two spin tunnel junctions) or a full Wheatstone bridge (four spin tunnel junctions). The magnetically sensitive electrode functions as well as a preferably laminated flux concentrator, resulting in a low noise single domain configuration, and allowing for magnetization flipping for offset correction. The very simple design allows easy definition of the fixed magnetization direction of the counter electrode.

What is claimed is:

1. A magnetic field sensor comprising: a first common, elongated ferromagnetic layer with an in plane easy magnetization axis normal to the elongation direction of said first layer, two further ferromagnetic layers with opposite magnetization directions and situated at some distance from each other along the longitudinal direction of the first layer, and an electrical insulation barrier layer (I) sandwiched between the first ferromagnetic layer and the two further ferromagnetic layers thereby forming a pair of magnetoresistance elements of the spin tunnel junction type.

2. The magnetic field sensor as claimed in claim 1, further comprising means for measuring resistance across the magnetoresistance elements of the spin tunnel junction type by conveying, in operation, a measuring current from one of the ferromagnetic layers through the insulation barrier layer to the other one of the ferromagnetic layers.

3. The magnetic field sensor as claimed in claim 1, in which the magnetization direction of the further magnetic layers is pinned.

4. The magnetic field sensor as claimed in claim 3, in which the pinned magnetization directions of the two further ferromagnetic layers F2 are normal to the easy axis direction of the first ferromagnetic layer F1.

5. A magnetic field sensing arrangement of the Wheatstone bridge type, comprising at least two magnetic field sensors as claimed in claim 1 in an operational relationship, the sensor comprising two first ferromagnetic layers (F1-l, F1-r) and two further ferromagnetic layers (F2-t, F2-b) forming two pairs of magnetoresistance elements of the spin tunnel junction type.

6. The magnetic field sensing arrangement as claimed in claim 5, wherein the two first ferromagnetic layers and the two further ferromagnetic layers are arranged in a crossing relationship.

7. The magnetic field sensor as claimed in claim 1, wherein at least one of the first and one of the two further ferromagnetic layers comprises upper and lower ferromagnetic sublayers and an intermediate metallic, non-ferromagnetic sublayer (NM).

8. The magnetic field sensor as claimed in claim 7, further comprising means for conveying current through the first ferromagnetic layer so as to define the magnetization directions in the upper and lower sublayers (F1-a, F1-b).

9. The magnetic field sensor as claimed in claim 8, wherein the current conveying means comprise means for alternately conveying currents of opposite polarity through the first ferromagnetic layer (F1), so as to flip the magnetization directions of the upper and lower sublayer.

10. The magnetic field sensor as claimed in claim 1 wherein the first ferromagnetic layer is wider at a point further from a magnetoresistance element than it is at a point adjacent said magnetoresistance element, thereby to optimize the flux concentration within said first ferromagnetic layer.

11. A magnetic field sensor comprising:
   a first elongate ferromagnetic layer with an in plane easy magnetization axis normal to the elongation direction of said first ferromagnetic layer,
   a second elongate ferromagnetic layer parallel to the first elongate ferromagnetic layer and with an in plane easy magnetization axis normal to the elongation direction of said second ferromagnetic layer,
   third and fourth parallel arranged elongate ferromagnetic layers with opposite magnetization directions and spaced apart from one another along the longitudinal directions of the first and second ferromagnetic layers, and
   an electric insulation layer sandwiched between the first and second ferromagnetic layers and the third and fourth ferromagnetic layers and forming pairs of magnetoresistance elements of the spin tunnel junction type.

12. The magnetic field sensor as claimed in claim 11 further comprising:
   means for passing a measuring current from the first and second ferromagnetic layers to the third and fourth ferromagnetic layers via the insulation layer, and
   means for measuring the resistance across the magnetoresistance elements in the presence of an applied magnetic field to be measured.

13. The magnetic field sensor as claimed in claim 11 further comprising:
   means for passing a current through the tunnel junctions of the magnetoresistance elements while the magnetic field sensor is aligned with an applied magnetic field to be measured, which magnetic field is applied in the plane of the first and second ferromagnetic layers and normal to the easy magnetization axes of the first and second ferromagnetic layers, and
   means for measuring the resistance across the magnetoresistance elements in the presence of said applied magnetic field.

14. The magnetic field sensor as claimed in claim 11 wherein the magnetization of the third and fourth ferromagnetic layers is pinned in magnetization directions normal to the easy axis directions of the first and second ferromagnetic layers.

15. The magnetic field sensor as claimed in claim 11 further comprising means for electrically connecting the magnetic resistance elements so as to form a Wheatstone bridge.

16. The magnetic field sensor as claimed in claim 11 wherein the third and fourth parallel arranged ferromagnetic layers are perpendicular to the first and second parallel arranged ferromagnetic layers and lie in a plane parallel to a plane formed by the first and second ferromagnetic layers.

17. The magnetic field sensor as claimed in claim 11 wherein each of the first and second ferromagnetic layers comprise first and second elongate ferromagnetic sublayers separated by an intermediate metallic non-ferromagnetic sublayer.

18. The magnetic field sensor as claimed in claim 11 wherein each of the third and fourth ferromagnetic layers comprise first and second elongate ferromagnetic sublayers separated by an intermediate metallic non-ferromagnetic sublayer.

19. The magnetic field sensor as claimed in claim 11 wherein at least one of said ferromagnetic layers comprise first and second elongate ferromagnetic sublayers separated by an intermediate metallic non-ferromagnetic sublayer, and
   means for alternately passing currents of opposite polarity through the one ferromagnetic layer so as to flip the magnetization directions of the first and second ferromagnetic sublayers.

20. The magnetic field sensor as claimed in claim 14 wherein each of the third and fourth ferromagnetic layers are pinned by arranging it in exchange contact with an antiferromagnetic layer (AF).

21. The magnetic field sensor as claimed in claim 14 wherein each of the third and fourth ferromagnetic layers are pinned by arranging it as a multi-layer construction including first and second ferromagnetic sublayers separated by a nonmagnetic metallic layer so as to form an artificial antiferromagnetic (AAF) where the layers are antiferromagnetically exchange coupled.

22. A magnetic field sensor comprising:
a first elongate ferromagnetic layer with an in plane easy magnetization axis normal to the elongation direction of said first ferromagnetic layer,
second and third elongate ferromagnetic layers with opposite pinned magnetization directions and spaced apart from one another along the longitudinal direction of the first ferromagnetic layer, and
an electric insulation layer sandwiched between the first ferromagnetic layer and the second and third pined ferromagnetic layers and forming pairs of magnetoresistance elements of the spin tunnel junction type.

23. The magnetic field sensor as claimed in 22 wherein the magnetization of the second and third ferromagnetic layers is pinned in magnetization directions normal to the easy axis direction of the first ferromagnetic layer.

24. The magnetic field sensor as claimed in claim 22 wherein the second and third ferromagnetic layers lie in a common plane and are parallel to one another.

25. The magnetic field sensor as claimed in claim 24 wherein the second and third parallel ferromagnetic layers are arranged in a crossing relationship to the first ferromagnetic layer and with said common plane parallel to the plane of the first ferromagnetic layer.

26. The magnetic field sensor as claimed in claim 22 wherein at least one of the ferromagnetic layers comprises first and second ferromagnetic sublayers having an intermediate metallic non-ferromagnetic sublayer therebetween.

27. The magnetic field sensor as claimed in claim 26 further comprising means for conveying current through the first ferromagnetic layer so as to define the magnetization directions in the first and second sublayers.

28. The magnetic field sensor as claimed in claim 27 wherein said current is an alternating current which can flip the magnetization directions of the first and second sublayers.

29. The magnetic field sensor as claimed in claim 22 further comprising:

means for passing a measuring current between the first ferromagnetic layer and the second and third ferromagnetic layers via the insulation layer, and
means for measuring the resistance across the magnetoresistance elements in the presence of an applied magnetic field to be measured.

30. The magnetic field sensor as claimed in claim 22 further comprising:
means for passing a current through the tunnel junctions of the magnetoresistance elements while the magnetic field sensor is aligned with an applied magnetic field to be measured, which magnetic field is applied in the plane of the first ferromagnetic layer and normal to the easy magnetization axis thereof, and
means for measuring the resistance across the magnetoresistance elements in the presence of said applied magnetic field.

31. The magnetic field sensor as claimed in claim 22 wherein in each of the second and third ferromagnetic layers are pinned by arranging it in exchange contact with an antiferromagnetic layer.

32. The magnetic field sensor as claimed in claim 22 further comprising a fourth elongate ferromagnetic layer parallel to the first elongate ferromagnetic layer and with an inplane easy magnetization axis normal to the elongation direction of said fourth ferromagnetic layer.

33. The magnetic field sensor as claimed in claim 1 wherein the two further ferromagnetic layers lie in a common plane.

34. The magnetic field sensor as claimed in claim 22 wherein the second and third ferromagnetic layers are parallel to one another and are pinned in opposite directions each parallel to the elongation direction of the first ferromagnetic layer.

35. The magnetic field sensor as claimed in claim 34 wherein the second and third ferromagnetic layers are arranged in a crossing relationship to the first ferromagnetic layer.

* * * * *